United States Patent [19]

Prokopp et al.

[11] Patent Number: 4,959,609

[45] Date of Patent: Sep. 25, 1990

[54] ELECTRICAL CONNECTING APPARATUS FOR AN ELECTRICAL OR ELECTRONIC TESTING UNIT

[75] Inventors: Manfred Prokopp, Am Felder 27, D-6980 Wertheim, Fed. Rep. of Germany; Herbert Kaufmann, Cham, Switzerland

[73] Assignee: Manfred Prokopp, Wertheim, Fed. Rep. of Germany

[21] Appl. No.: 300,957

[22] Filed: Jan. 23, 1989

[30] Foreign Application Priority Data

Jan. 27, 1988 [DE] Fed. Rep. of Germany ....... 3802304

[51] Int. Cl.$^5$ ...................... G01R 31/04; H01R 13/44
[52] U.S. Cl. ............................ 324/158 F; 324/158 F; 439/140
[58] Field of Search ........... 324/158 F, 158 P, 73 PC, 324/725; 439/482, 844, 139, 140, 141, 69, 70, 68

[56] References Cited

U.S. PATENT DOCUMENTS

| 3,513,435 | 5/1970 | Degaetano | 439/140 |
| 3,575,684 | 4/1971 | McIntyre | 439/140 |
| 3,996,516 | 12/1976 | Luther | 324/158 P |
| 4,626,780 | 12/1986 | Powers et al. | 324/158 F |
| 4,658,212 | 4/1987 | Ozawa et al. | 324/158 F |
| 4,902,968 | 2/1980 | Sugimoto | 324/158 F |

FOREIGN PATENT DOCUMENTS 2613858 7/1977 Fed. Rep. of Germany.
2113480 8/1983 United Kingdom.

Primary Examiner—Reinhard J. Eisenzopf
Assistant Examiner—Vinh P. Nguyen
Attorney, Agent, or Firm—Herbert Dubno

[57] ABSTRACT

The electrical connecting apparatus tests for electrical faults in an electrical and/or electronic device having a circuit board, wire support or the like equipped with a plurality of blade-terminal strips and/or sleeve-terminal strips has at least one supporting device which has test contacts for testing the blades or sleeves of the blade-terminal strips and/or sleeve-terminal strips of the device being tested and restoring springs which may include a plurality of coil springs. The electrical contact between the socket and/or terminal strip of the device being tested and the test contacts is made by at least partially overcoming the spring forces of the restoring springs.

24 Claims, 6 Drawing Sheets

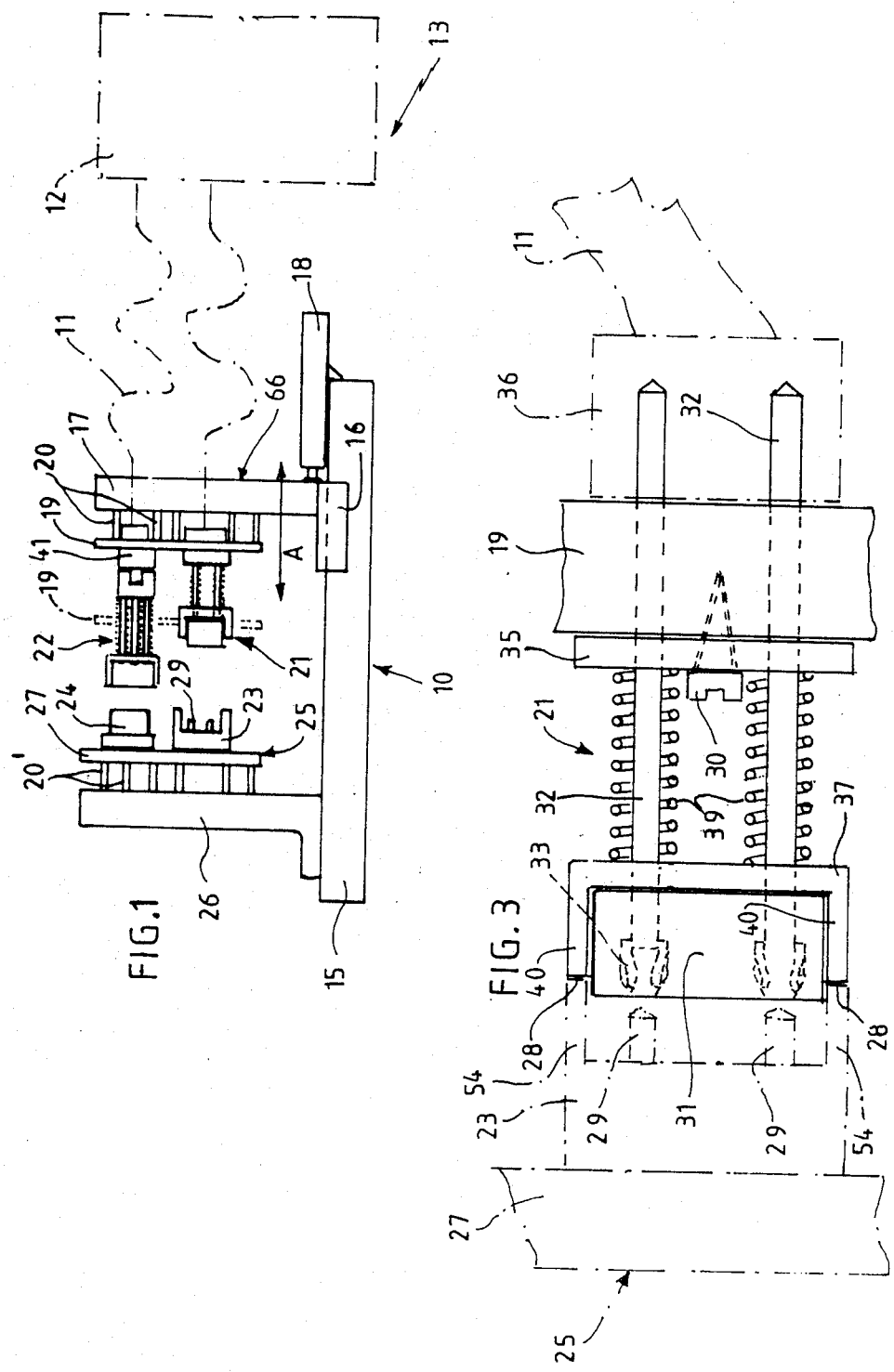

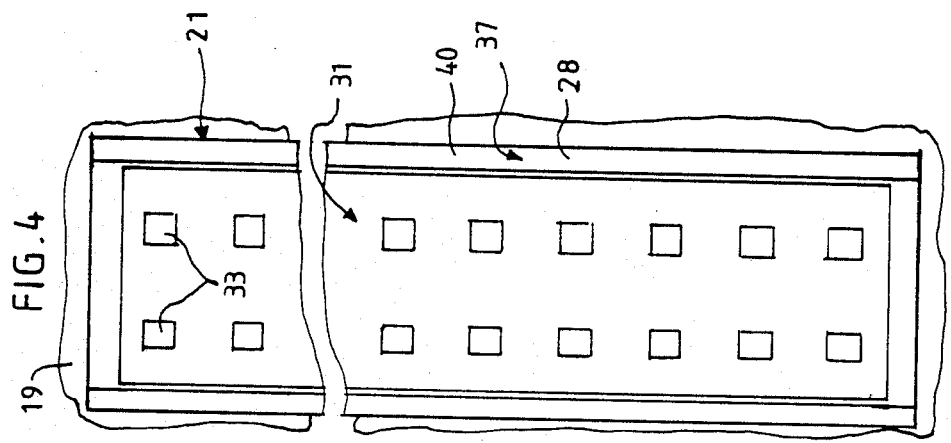
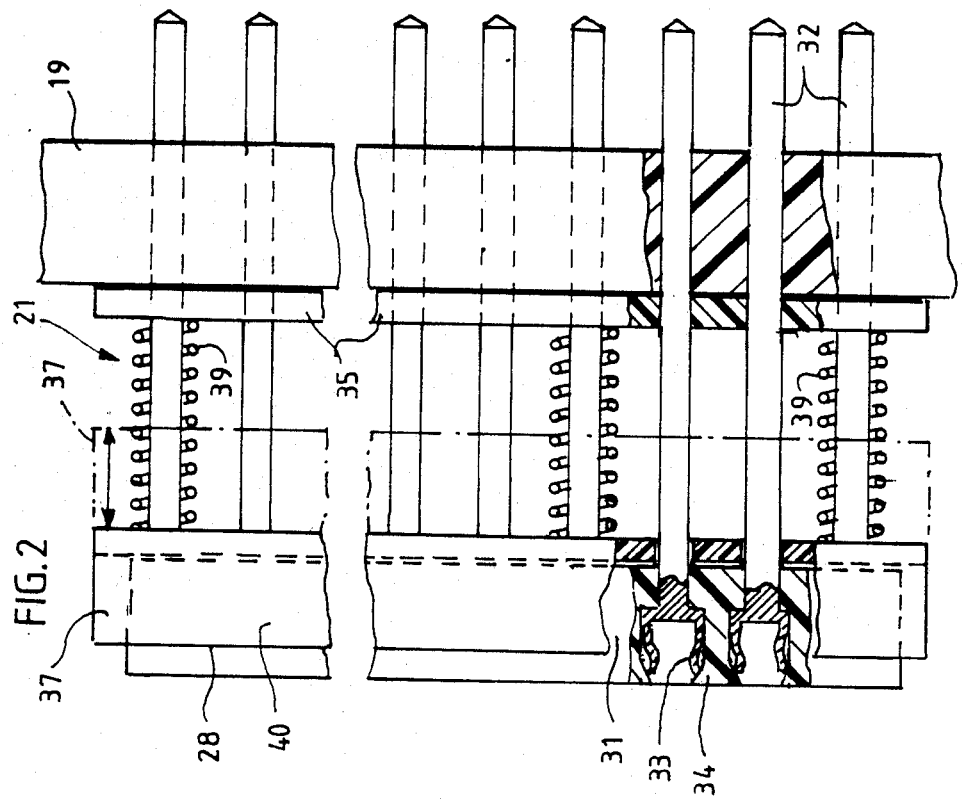

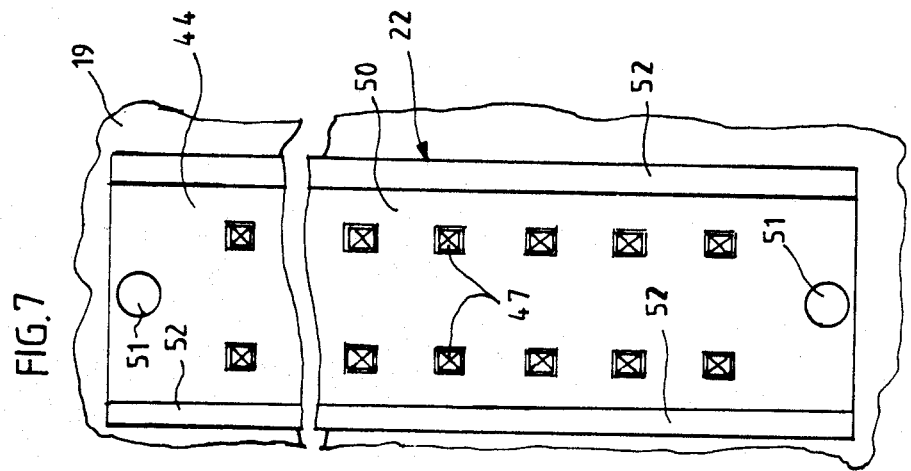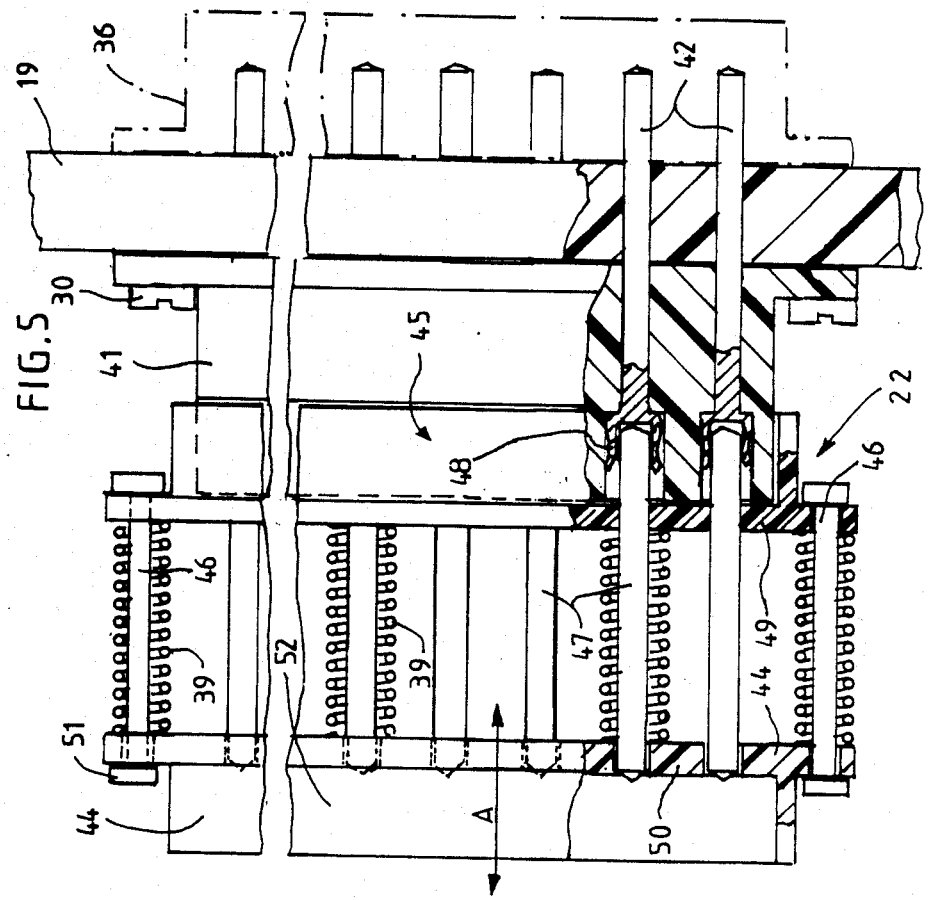

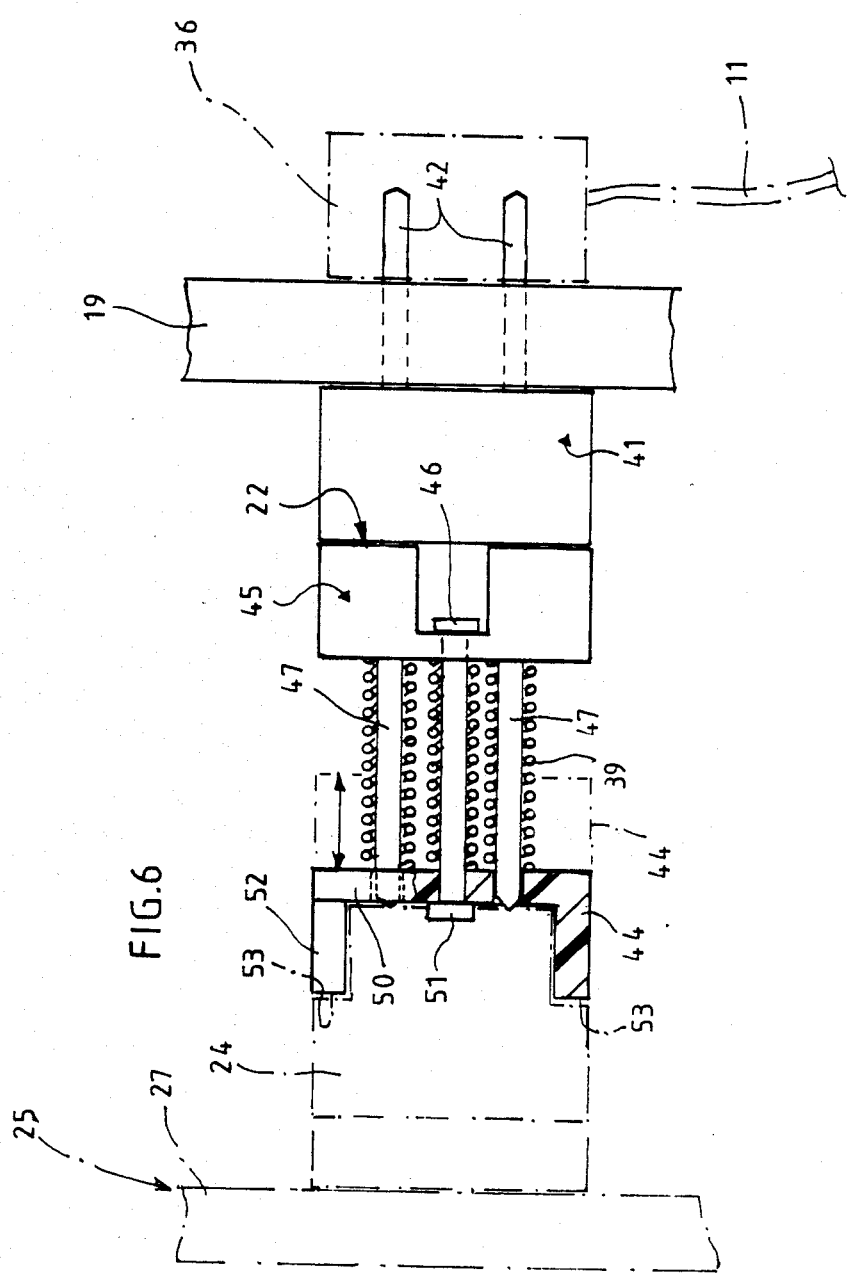

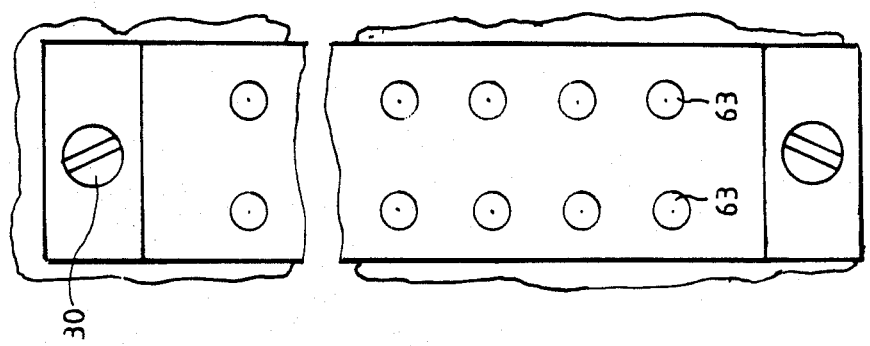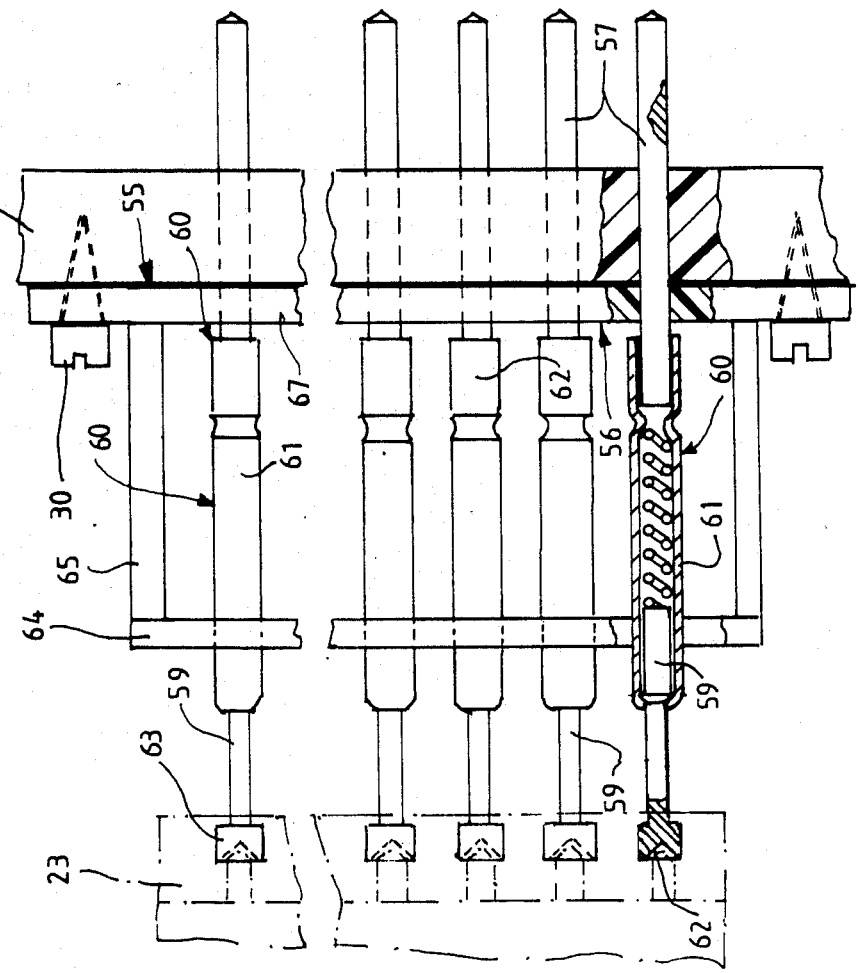

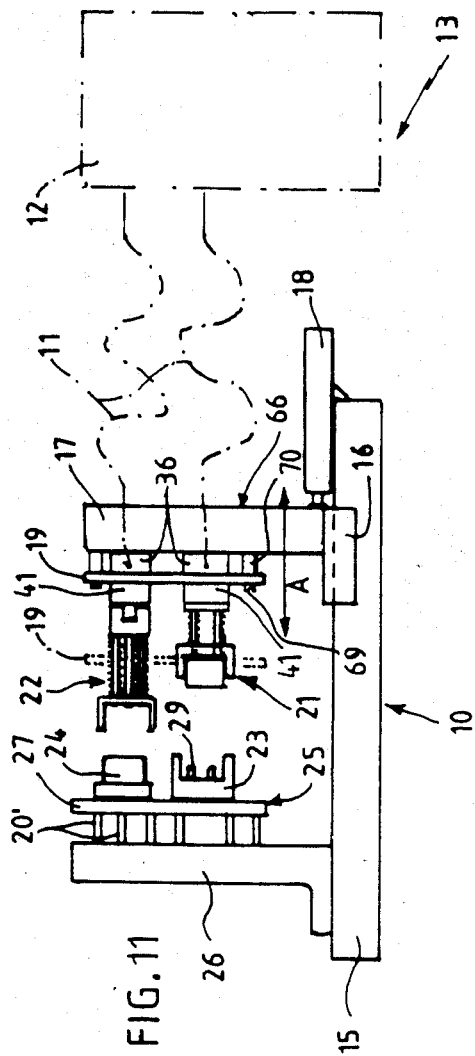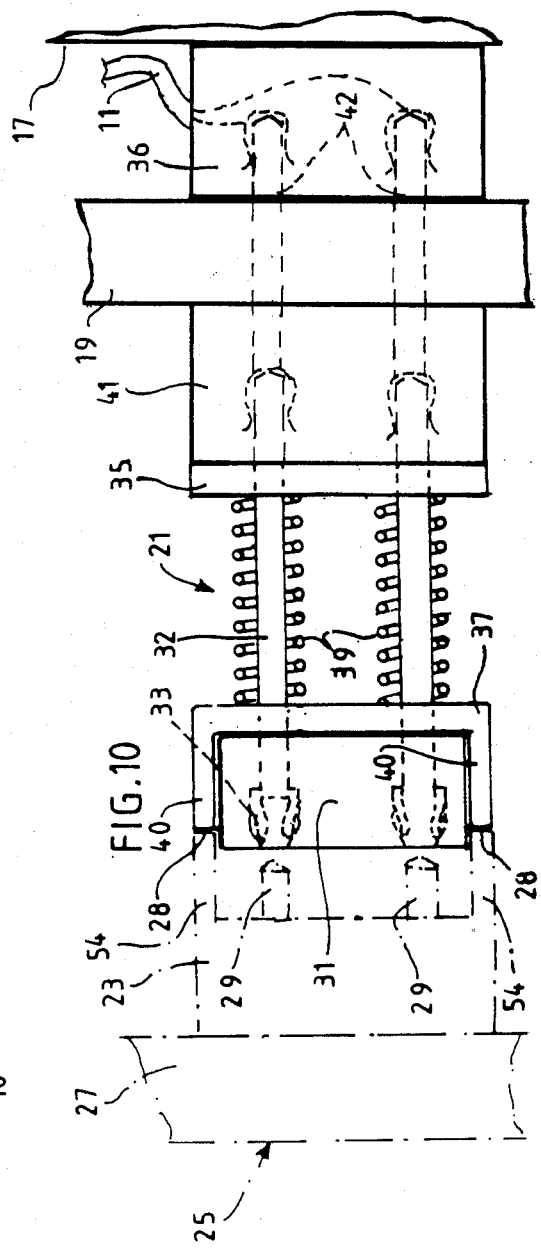

ELECTRICAL CONNECTING APPARATUS FOR AN ELECTRICAL OR ELECTRONIC TESTING UNIT

FIELD OF THE INVENTION

Our present invention relates to an electrical connecting apparatus for a testing unit for testing electrical or electronic devices and, more particularly, to an electrical connecting apparatus for an electrical or electronic testing unit for devices having circuit boards, wiring-support devices or the like equipped with a plurality of blade-terminal strips and/or sleeve-terminal strips.

BACKGROUND OF THE INVENTION

The sleeve-terminal strips and blade-terminal strips of such a device to be tested normally have a comparatively large number of blades or sleeves, e.g. there may be one or several rows parallel to each other for each socket or terminal strip with 32 or more blades or sleeves in each row.

In the case of a blade strip there is usually a group of rigid metallic pins each of which is rectangular in cross section and which is pointed at its free end. This terminal strip can also be designated as a male connector.

The electrical or electronic device being tested has a circuit board, a wiring support which has wiring on it or the like with a large number of blade-terminal strips and/or sleeve-terminal strips usually, e.g. with ten to more than a hundred such strips.

The known testing unit for testing such a device has a number of complementary sleeve-terminal strips and/or blade-terminal strips corresponding to those of the device, which are attached at the end of a flexible cable which makes the electrical connection between them and the tester of the testing unit.

Up to now, to test an electrical or electronic device all the complementary terminal and/or sleeve-terminal strips continuously connected to the tester by the cable had to be connected by an operator individually one after the other to the associated sleeve-terminal strips and blade-terminal strips of the device manually. That required a considerable amount of time and effort. When all the blade-terminal strips and sleeve-terminal strips of the device were connected to the tester in this way, the device was tested for electrical faults.

After the testing is completed the complementary connected sleeve-terminal strips and blade-terminal strips must again be disconnected by hand from the device being tested which requires considerable time and puts undesirable stresses on the device. Also it is difficult, when the tester indicates a certain fault in the device, to provide access to the appropriate location of the clamped device being tested for removal of the fault.

OBJECTS OF THE INVENTION

It is an object of our invention to provide an electrical connecting apparatus for performing the testing unit electrical connection to or disconnection from an electrical or electronic device quickly and easily.

It is another object of the invention to provide an electrical connecting apparatus for making or breaking the electrical connections of an electrical or electronic device having a plurality of blades and/or sleeves with a testing unit having a corresponding number of contacts quickly and easily.

SUMMARY OF THE INVENTION

These objects and others which will become more readily apparent hereinafter are attained in accordance with our invention in a electrical connecting apparatus for a testing unit for testing of electrical or electronic devices for electrical faults which have a circuit board, wiring support or supporting member or the like equipped with a plurality of blade-terminal strips and/or sleeve-terminal strips.

According to our invention the electrical connecting apparatus has at least one supporting device which has a plurality of test contacts for contacting the blades and/or sleeves of the terminal and/or sleeve-terminal strips on the device and the electrical connecting apparatus has restoring spring means. The connection between the blades and/or sleeves of the terminal and/or sleeve-terminal strips of the device being tested and the test contacts is made by overcoming the spring forces of the restoring spring means.

This electrical connecting apparatus allows rapid and simple simultaneous connection of all sleeves and blade-terminal strips of the device to the testing unit and simultaneous rapid breaking of these electrical connections This can be effected completely or partially automatically so that no operator is necessary or only a minimum of operator attention is necessary With devices being tested with only a few blade-terminal strips and/or sleeve-terminal strips, the operator can perform the connection and separation of the blade-terminal strips and/or the sleeve-terminal strips of the device with or from the test contacts of the testing unit manually, advantageously by a device with a force-reducing transmission mechanism, i.e. a hydraulic transmission drive.

The test contacts, which act for contacting the blades and sleeves of the blade-terminal strips and sleeve-terminal strips of the device, are mounted on a supporting device. It can advantageously be provided with at least one positioning motor which brings the test contacts carried by this supporting device into contact with the device without human effort to make contact automatically between the sleeve-terminal strips and the blade-terminal strips of the device and the test contacts of the electrical connecting apparatus. Still other test contacts can be located on this supporting device which acts to contact the positions of the device, e.g. for the circuit boards and the like.

In many cases the device being tested has on one of its sides blade-terminal strips to be contacted and/or sleeve-terminal strips and it is then sufficient for the electrical connecting apparatus to have a single supporting device with test contacts. When in contrast, which is often the case, the device carries on both its sides blade-terminal strips and/or sleeve-terminal strips, which must all be brought jointly into electrical connection with the tester for testing of the device, then the electrical connecting apparatus can have a supporting device with test contacts for contacting the related terminal strip and/or socket strip of the device for each of the sides of the device.

In this case the device may be clamped strongly and both supporting devices can be simultaneously moved to both sides of the device to make intimate contact of the test contacts with the terminal strip to be contacted and/or the socket strip and after testing contact is broken With two supporting devices alternatively the device may be driven until the electrical connection between the test contacts and the blade-terminal strips and/or the sleeve-terminal strips on the appropriate sites on the device are made. Then another supporting device may be driven to the other side of the device and the required connections between the test contacts and the sleeve-terminal strips and/or the blade-terminal strips to be contacted on the related side are made. The breaking of the electrical connections can then occur in reverse sequence.

When only one supporting device is present, it or the device being tested can be held locally fixed and the device and/or the supporting device can be moved, e.g. on a carriage or on a lever system, until the electrical connections between its test contacts and the blade-terminal strips and/or the sleeve-terminal strips to be contacted by them are made.

The electric connections of the test contacts of the supporting device with the blades and sleeves of all the blade-terminal strips and/or the sleeve-terminal strips of the device are performed without problems with the extremely large forces which are often involved because, in guiding the test contacts and the device being tested together, the device being tested and the supporting device are only acted on by the test contacts on pressing them together but not when they are pulled apart or by pulling forces. The support of the parts lo holding the test contacts or carrying them directly and of the devices being tested against a pressure or pressing action is possible without problem so that the test contacts of the device can be guided together with sufficiently large force without problem until the test contacts come into reliable contact electrically with the sleeves and/or blades of the related socket and/or blade-terminal strips. The restoring spring means, which already can be compressed or not, are additionally pressed. Now, when these electrical connections between the test contacts and the terminal and/or sleeve-terminal strips of the device are to be loosened, this occurs without problem if they exert at least partially, advantageously completely, the required force for this to occur. This is of greatest significance when the contacting connections between the sleeves and/or the blades of the devices being tested and the test contacts are socket connections which require considerable forces for overcoming the frictional forces involved in their making and breaking. In the latter case then the supporting device and the device being tested can be acted on only in pressing and not on pulling, which is also true on separation of the test contacts from the device being tested. No stresses or pulling forces are involved which is highly advantageous.

Advantageously the electrical connection between the terminal strip and/or the socket strip of the device being tested and the test contacts can be a socket connection.

The socket connection has among other things special advantages. It may be suitable for later socket connections, with which the device is connected to an electrical tester, and so that faults can be detected in the testing which would otherwise be undetected, e.g. defective blades and/or sleeves. Socket connections result in especially good connections. The test contacts can be sleeves and blades of commercially marketed blade-terminal strips and/or sleeve-terminal strips, which require only comparatively slight subsequent work.

The restoring spring means of the electrical connecting apparatus has a very important purpose, namely the release or disengagement of the test contacts of the blade-terminal strips and/or sleeve-terminal strips of the device without problem and without danger of damage to the device, when the simultaneously it is necessary to apply a large force to pull the test contacts from the sleeves and if necessary from the blades of the device. Also the circuit board or the like of the device may then be somewhat less rigid and its construction may then be somewhat simplified.

The supporting device can have a comparatively thin supporting plate on which the test contacts are mounted and which can be similarly supported without problems from pressing forces.

Advantageously the restoring spring means can also be strengthened so that they alone are sufficient to separate or disengage the test contacts from the blade-terminal strips and/or sleeve-terminal strips of the device so that the motorized drive or the operator, who performs this action, need not exert any pulling force on the supporting device and the device being tested on separating the test contacts from the terminal strip and/or the socket strip of the device, since the restoring spring means alone causes the breaking of the electrical connection between the test contacts and the device. It is only required for this that the space between the supporting device and the device being tested by the drive or the operator is increased after ending the testing.

The restoring force means can advantageously have restoring springs or can comprise restoring springs which are mounted on the test contacts. It is particularly desirable for a good separation of the test contacts and the terminal sleeves and/or the sleeve-terminal strips of the device, for the restoring springs and/or at least one portion of the connecting device loaded by them to be directly supported on the blade-terminal strips and/or sleeve-terminal strips to be contacted by the test contacts and so that the breaking of the electrical contact between the device being tested and the test contacts can be especially carefully done.

It is also possible to distribute all the restoring springs or at least one correlated with the test contact adjacent it, e.g. one, several or a large number of restoring springs between the test contacts and/or beyond the supporting device laterally from them so that the restoring springs and/or at least one portion of the connecting device loaded by them engages on places which are accessible. However these places cannot be electrically conductive pathways, electrical contacts and other places on the device being tested, which may not be contacted by the springs.

It is especially suitable when at least one restoring spring of the restoring spring means spring-loads at least one movable, advantageously linearly guidable, pressing member, which is pressable by at least one of the restoring springs associated with it to the position or positions to be contacted on contacting the device being tested.

Advantageously it is pressable on at least one terminal strip and/or socket strip of the device being tested. The pressing member can be guided linearly to the electrical connecting apparatus and/or is so constructed that it can come into contact with a projection, a shoulder or the facing side of the terminal strip and/or the socket strip of the device, advantageously approximately over the entire length of the terminal strip and/or socket strip.

This pressing member can advantageously be constructed the same as or like the plastic member of the terminal strip and/or the socket strip of the device so that the pressing member, which is designed for intimate contact with the terminal strip of the device, is the same or similar to the plastic member of a socket strip complementing this terminal strip and/or so that, in the case of a socket strip of a device being tested, the pressing member of the electrical connecting apparatus, which is designed for intimate contact with this socket strip is the same or similar to the plastic member of the complimentary terminal strip corresponding to this socket strip. Thus when the test contacts are constructed simultaneously like blades and/or sleeves of the terminal strip and/or sleeve-terminal strips of the device or form such blades and/or sleeves, the contacting of the blade-terminal strips and/or sleeve-terminal strips of the device being tested by the electrical connecting apparatus is effected practically exactly as it is effected in later connection of the device to the electronic or electrical tester by complementary sleeve-terminal strips and/or blade-terminal strips which can be connected to its terminal and/or sleeve-terminal strips. Also this reduces the cost of the electrical connecting apparatus, since conventional plastic components including sleeve-terminal strips and/or blade-terminal strips can be used with only slight subsequent changes for these pressing members.

It is especially advantageous when at least one, advantageously all, the test contacts acting for contacting the sleeves of the sleeve-terminal strips of the device being tested are axial rigid pins. These rigid pins are advantageously the blades of a terminal strip. This terminal strip can have the same plastic components as the blade-terminal strips of the device being tested. However the blades of the blade-terminal strips on the electrical connecting apparatus are advantageously longer than the blades of the blade-terminal strips on the electrical or electronic device being tested. On these blades of the blade-terminal strips on the electrical connecting apparatus advantageously pressing members made from plastic members can be mounted which have a single passage for each terminal, which is penetrated by one terminal with sliding play. The blades acting as test contacts can advantageously have a rectangular cross section and can be pointed on their free ends. It is however also possible to construct them in other ways, for example as circularly cylindrical pins with pointed free ends or the like.

In many cases it is advantageous to provide that at least one test contact acting to contact the blades of the blade-terminal strips and/or the sleeves of the sleeve-terminal strips of the device is a spring contact pin. Spring contact pins are known. However up to now they have not been used for contacting contact strips and sleeve-terminal strips of the device. A spring contact pin has a slidably mounted linearly guided piston member which is loaded or is loadable in the direction of the device by at least one coil spring. The coil spring supports itself on a stop means which is stationary relative to a supporting member and/or in the supporting device itself. Advantageously the spring contact pin however is constructed so that its piston member is slidably mounted in a sleeve, in which also the at least one coil spring forming a restoring spring loading it is mounted.

The front end facing the device being tested of the advantageously axially rigid piston member of the spring contact pin contacts a terminal or a socket of the device.

The spring contact pin has, when it acts to contact the blades of a device being tested, the advantage relative to the rigid pin as a test contact that the restoring spring can be constructed weaker, since the terminal of the device being tested does not contact electrically on connection to a socket. The contact is effected with axial friction between the terminal and the contact piston. Also it is possible to break this contact without overcoming friction and the spring acts to bring about a secure electrical contact between the piston member and the terminal.

In many cases it is particularly advantageous when the test contacts acting to contact the blades of at least one terminal strip of a device being tested are the sleeves of at least one socket strip, which is a complementary socket strip for the terminal strip of the device to be contacted electrically by it. The individual socket strip, which is also located on the supporting device, can thus in many cases be loaded by restoring spring means mounted so as to be movable, advantageously guided linearly, on it, and constructed similar to or the same as the sleeve-terminal strips of the device, but with the distinction or difference that further features for its guiding are provided on their plastic members.

The socket strip can be fixed on the supporting device of the electrical connecting apparatus and a pressing member loaded by the restoring springs and mounted movable on the supporting device is associated with it, which is pushed back on contacting a terminal strip of the device by this terminal strip against the action of the restoring spring in the direction of the supporting device under compression or additional compression of the restoring springs.

After ending of the testing of the device, when the supporting device and the device are again moved away from each other, then the force drawing away the socket strip mounted fixed on the supporting device from the associated terminal strip of the device can be produced at least in part, advantageously entirely, as a result of its spring-loading.

Advantageously the test contacts are arranged in structural units mounted detachably on the supporting device. Each structural unit is constructed to contact all blades or sleeves of a terminal or socket strip of the related device That has the advantage among others that this structural unit allows a particularly simple fitting of the electrical connecting apparatus to the device and it can be used again in other arrangements.

The supporting device can have a one-piece or multipartite structure. Thus they advantageously can have one or more supports or supporting devices, advantageously one or more supporting plates, on which the test contacts are mounted.

Since advantageously the supporting device is acted on with only a minimal pulling force or virtually no pulling force during making or breaking of the connection between the device and the test contacts, it is also not necessary to arrange the test contacts on the supporting device so that a pulling force or a considerable pulling force may be exerted on them without changing their position relative to the supporting device. This allows them to be held releasably under frictional forces just fitting together according to their shape in connecting members mounted on the supporting device by socket connections acting to make the electrical connection. These can be in sleeve-terminal strips and/or blade-terminal strips, advantageously only by the socket connections acting for electrical connection between these parts, so that these connecting members likewise can be held under frictional forces in a press fit releasably in the supporting devices by socket connections acting for their electrical connection Thus for electrical connection and for support of a group of test contacts forming a structural unit on a supporting plate or other support a connecting member for it is provided, which penetrates the supporting device by a connecting pin serving for electrical connection and a connecting member of this is mounted on the support of another connecting member, advantageously a socket strip, in a press fit under friction.

Then no additional attachment of this connecting member to the support is necessary but only its assembly so that the exact position of this connecting member is determined by the positioning of at least two connecting pins penetrating passages in the supporting plate of the supporting device receiving and fitting it.

BRIEF DESCRIPTION OF THE DRAWING

The above and other objects, features and advantages of our invention will become more readily apparent from the following specific description, reference being made to the accompanying drawing in which:

FIG. 1 is a side elevational view of an electrical connecting apparatus according to one embodiment of our invention in which an electrical and/or electronic device to be tested is plugged in, in which only one terminal strip and socket strip is seen but which it normally has a large number of blade-terminal strips and/or sleeve-terminal strips which are simultaneously contactable by test contacts located in the electrical connecting apparatus;

FIG. 2 is a partially sectional side elevational view of one group of test contacts forming one structural unit in the apparatus of FIG. 1, which acts to contact a terminal strip of the device shown in FIG. 1;

FIG. 3 is a detail view of the group of test contacts shown in FIG. 2;

FIG. 4 is a top plan view of the group of test contacts of the apparatus of FIGS. 2 and 3;

FIG. 5 is a cross sectional side elevational view, partly broken away, of another group of test contacts of FIG. 1 which similarly form a structural unit, which contact a socket strip of the device to be tested in FIG. 1;

FIG. 6 is a partially broken away detail side view of the group of test contacts according to FIG. 5;

FIG. 7 is a broken away top plan view of the group of test contacts of FIGS. 5 and 6;

FIG. 8 is a broken away partial cross sectional side elevational view of a group of test contacts forming a structural unit according to an additional embodiment which acts to contact a terminal strip of another electrical and/or electronic device to be tested;

FIG. 9 is a top plan view of the group of test contacts of FIG. 8;

FIG. 10 is a detail side view of a different embodiment of the electrical connecting apparatus according to the invention similar to that of FIG. 3; and FIG. 11 is a side elevational view of a different embodiment of the electrical connecting apparatus according to the invention similar to that of FIG. 1.

SPECIFIC DESCRIPTION

The electrical connecting apparatus illustrated in FIG. 1 is connected to a tester 12 indicated with dot-dashed lines by a flexible cable 11 also indicated with dot-dashed lines and forms a testing unit 13 together with this tester 12 for testing a plurality of electrical or electronic devices 25 having a very large number of blade-terminal strips and/or sleeve-terminal strips.

Each device 25 is held on a stationary holder 26 which is mounted on a frame 15. It is sufficient in many cases to set or lean the device in a predetermined position on the holder 26, via supports 20'.

The frame 15 of the electrical connecting apparatus 10 is locally fixed and a horizontally guided carriage 16 is mounted on it, which is movable to and fro horizontally in the direction of the double-headed arrow A by a hydraulic or pneumatic piston-cylinder-unit 18 which acts as a positioning drive.

A rigid supporting device 66 having two plates 17 and 19 and a plurality of connecting posts 20 is rigidly attached to the carriage 16. The base plate 17 is mounted vertically on the carriage 16 and supporting plate 19 is held releasably on it and supported on its rear side at a plurality of points by the rigid connecting posts 20 of the supporting device 66 against a front load. These connecting posts 20 contact on the supporting plate 19 at positions where electrical contacts are not present. The supporting plate 19 can be made of an electrical insulator such as Plexiglass (Polyacrylate) or the like. A plurality of groups of test contacts 21, 22 each forming a structural unit, of which only two are shown, are rigidly mounted on plate 19. Each group of test contacts 21, 22 acts to contact a terminal strip such as 23 or a socket strip such as 24 which are located on the device 25 being tested for electrical faults by this testing unit 13. The illustrated device 25 being tested has in this example a circuit board 27 on whose front a plurality of blade-terminal strips such as 23 and sleeve-terminal strips such as 24 are located, of which only one each is illustrated.

The individual terminal strip 23 and/or individual socket strip 24 each has two rows of blades 29 and/or sleeves which are not seen. Each row has for example thirty two blades 29 and/or sleeves equally spaced from each other.

The terminal and/or sleeve-terminal strips can, if necessary, also have only one row or more than two rows of blades and/or sleeves, e.g. they each can have three rows. The groups of test contacts 21, 22 acting to make contact are arranged on the supporting plate 19 in the same configuration as these blade-terminal strips and sleeve-terminal strips 23, 24. This arrangement of groups of test contacts 21, 22 is also made to conform to the arrangement of the blade-terminal strips and the sleeve-terminal strips on the device being tested.

Usually a large number of the devices being tested are contacted in succession by the test contact groups located on the supporting plate 19 to test the group of devices. When the structure of the device varies, the groups of test contacts 21, 22 on the supporting plate 19 or on another suitable supporting plate must be arranged corresponding to the structure of the other device. These supporting plates are replaceable. Besides the groups of test contacts 21, 22 which act for contact of the blade-terminal strips and/or sleeve-terminal strips 23, 24 of the device 25, still more test contacts can be provided on the supporting plate 19 for contacting other electrical or electronic parts or positions, such as conductive strips or the like, whose test contacts similarly are connected electrically with the tester 12.

Conductive strips and other electrical and electronic parts can be provided additionally in an unshown way on the circuit board 27 of the device to be tested 25 which carries these blade-terminal strips and sleeve-terminal strips 23, 24.

In FIGS. 2 to 4 the group of test contacts 21 of the apparatus of FIG. 1 serving for contacting all the blades of a terminal strip 23 of the device being tested 25 is illustrated in detail. They have a fixed socket strip 31 attached detachably on the supporting plate 19 only by the screws 30 shown in FIG. 3 with a plurality of metal sleeves 33 located in its plastic portion 34 acting as test contacts corresponding to the number of the blades 29 of the terminal portion 23 to be contacted. Instead of the sleeves also as desired other test contacts can be provided, however sleeves are especially advantageous. A straight metallic pin 32 formed as a terminal of a terminal strip is rigidly attached to each socket 33.

These metallic pins 32 which are parallel to each other protrude beyond the socket strip 31 on the rear side and are mounted in a plastic plate 35 penetrated by them which is attached to the supporting plate 19 by screws 30. They rest on the front side of the supporting plate 19. These straight pins 32 reside or are forced through holes in the supporting plate 19 and protrude beyond the rear side where a socket strip 36 is mounted on them for electrical connection. The socket strip 36 is connected by a cable 11 with the tester 12.

The screwing of the plates 35 to the supporting plate 19 can also be omitted, when the socket connection of the pins 32 with the socket strip 36 of the plate 35 provides sufficient retention. In this situation at least two of the pins 32 just fit in the passages through the plate 19 acting to position this plate 35. And of course this is possible—and it allows a quick and simple mounting of the groups of test contacts 21, 22—when, as is advantageously provided, no or only very little pulling forces are exerted on the groups of test contacts 21, 22 on the device 25 to be tested on making or breaking the connection between the groups of test contacts 21, 22 and the device being tested.

The socket strip 31 can be of a type which is commonly used in the trade. It is not movable relative to the supporting plate 19. A U-shaped pressing member 37 is mounted axially slidable between the plate 35 and the plastic portion 34 in the vicinity of the pins 32, which can have a structure like the plastic portion of a terminal strip and has a passage for each and every pin 32. These passages are penetrated by the pins 32 for linear guiding of the pressing member 37 with sliding play.

Coil springs 29 which brace themselves on the plate 35 on its side wall and contact with its front end under compression on the flat rear side of the pressing member 37 are mounted in the vicinity of each pin 32 between this pressing member 37 and the plastic plate 35. This pressing member 37 is pressed by this restoring spring 39 on the rear side of the plastic portion 34. The pressing member 37 has two longitudinal side walls 40 which extend along the longitudinal side wall of the plastic portion 34 and have sliding play on it.

This group of test contacts 21 can, since it forms a complete unit in itself, can be unscrewed from the supporting plate 19 and screwed to another supporting plate for testing of other devices being tested. Also this group of test contacts can be made and sold by itself and can be mounted for marketing purposes on the supporting plate in a variety of arrangements. That also goes for the other groups of test contacts 22 and 55 which are shown in detail in FIGS. 5 and 9.

The plastic portion of the terminal strip 23 to be contacted by the group of test contacts 21 has two longitudinal side walls 54 parallel to each other which protrude beyond the free ends of the blades located in them and act to come into contact with the edges 28 of both longitudinal side walls 40 of the pressing member 37 of the groups of test contacts 21 to shift this pressing member 37 in making the socket connection between the terminal 29 of the terminal strip 23 of the device to be tested 25 and the sleeves of the socket strip 31 of the group of test contacts 21 against the force of the restoring springs 39 in the direction of the supporting plate 19.

The total force thus exerted by the restoring springs 39 on the pressing member 37 is thus so large that it alone is sufficient to loosen the socket connection between the blades 29 of the terminal strip 23 of the device 25 and the sleeves 33 of the sleeves strips 31 of the groups of the pressing contacts 21 so that this total force of these springs 39 corresponds at least to the total friction force between these sleeves and blades which is effected during loosening these socket connections and thus no pulling force need be exerted on the supporting plate 19 to loosen this socket connection.

The group of test contacts 22 illustrated in detail in FIGS. 5 to 7 acts to contact all sleeves of a socket strip 24 of the device 25 being tested. This structural unit 22 is inserted releasably in a socket strip 41 attached detachably to the supporting plate 19 by screws 30 whose blades form connector pins 42 penetrating passages in the supporting plate 19 and protruding beyond them on the rear side and on these connector pins 42 a commercial socket strip 36 attached with the tester 12 is connected electrically by a cable 11 for electrical connection of this group of test contacts 22 to the tester 12. The group of test contacts 22 has a terminal strip 45, restoring springs 39 and a pressing member 44 and is held together by two guiding and retaining rods 46.

The terminal strip 45 can be a commercially marketed device and its blades 47 are plugged in the sleeves 48 of the socket strip 41 to connect it electrically. This socket connection suffices to retain the group of test contacts on the terminal strip 45 as a result of the pressing member 44, since that prevents the socket strip 24 of the device 25 from exerting a force on the group of test contacts 22.

The blades 47 protrude in the direction of the device 25 to be tested far beyond the plastic member 49 of this terminal strip 45 and engage with sliding play in the passages of the base 50 of the pressing member 44, which can be the plastic member of a terminal strip. The pressing member 44 having a U-shaped cross section can move toward a socket strip 24 of the device 25 to be contacted without application of an external force, since the blades 47 do not protrude or only slightly protrudes beyond the base 50 as long as the pressing member 44 is pressed by the restoring springs 39 to the stop means on the rods 46 formed by their widened heads 51. These rods 46 are attached to the plastic member 49.

On several of the blades 47 coil springs 39 are mounted in the region between the plastic member 49 and the pressing member 44 (Of course in their place several other metallic pins can be provided). Springs can also be provided on both rods 46 on the ends of these structural units 22.

The straight pressing member 44 having a U-shaped cross section has two longitudinal side walls 52 parallel to each other, which are directed from the base 50 to the device being contacted 25 and moreover are designed to come into contact on each one of two straight step-like shoulders 53 on each longitudinal side wall of the plastic member of a socket strip 24 to be contact by this group of test contacts on the device 25.

Then the socket strip 24 can rest on the pressing member 44 to shift it on the blades 47 horizontally e.g. until in the dot-dashed position under strong compression from the restoring springs 39, when the supporting plate 19 is moved to the left to slide the blades 47 in the sleeves of the socket strip 24. Alternatively it can be provided that the front side of the socket strip 24 arrives at the base 50 of the pressing member 44 for retention during the further motion of the terminal 47.

When the supporting plate 19 is moved left by the piston-cylinder-unit 18 in FIG. 1, then the pressing member 44 arrives at the associated socket strip 24 on the device being tested 25 and both longitudinal side walls of the pressing member move with slight sliding play on both longitudinal side walls of the socket strip 24 until they seat on the step-like shoulder 53. That is effected with practically no force, since the blades 47 still are not forced in the sleeves of the socket strip. Now the pressing member 44 however can move no further.

Then the supporting plate 19 is moved further in the direction of the device 25 to be tested by the piston-cylinder-unit 18 and it thus now forces the blades 47 of the terminal strip 45 of the group of tester contacts 22 into the associated sleeves of the socket strip 24 and the piston-cylinder unit 18 carries this motion further so that a secure contact between the blades 47 and the sleeves are attained, as similarly is effected in practice, when one plugs a terminal strip manually on this socket strip 24. Thus these restoring springs 39 of the group of test contacts 22 are strongly clamped, since the spacing between the pressing member 44 and the plastic member 49 of the terminal strip 45 is reduced. The spring forces present in the springs 39 are so large that this socket connection of the socket strip 24 of the device 25 with the blades of the groups of test contacts 22 can be released by the spring force of the restoring springs 39 alone, if the piston-cylinder-unit 18 moves the carriage 16 and thus the supporting plate 19 again to the right (FIG. 1) after a successful test. Parallel and simultaneously with the making and the breaking of the socket connection of the blades 47 with the socket strip 24 by the piston-cylinder-unit 18 also the already-described making and breaking of the socket connection between the blades 29 of the blade-terminal strips 23 of the device 25 being tested and the sleeves of the sleeve-terminal strips 31 of the group of test contacts 21. Also all additional unshown groups of test contacts 21,22 are made or broken with the other blade-terminal strips and/or sleeve-terminal strips which are arranged on the device 25 to be tested. For each terminal strip and socket strip on the device a corresponding structural unit 21 and/or 22 is provided on the supporting plate 19 so that all blade-terminal strips 23 and sleeve-terminal strips of the device simultaneously can be brought into contact by groups of test contacts arranged in a suitable configuration on the supporting plate.

The pressing member 37 of FIG. 3 is already held by the terminal strip 23 on motion of the supporting plate 19 to the left, before the blades 29 of the terminal strip are forced by further motion of the supporting plate in the sleeves 33 to make electrical contact with the groups 21 of test contacts. The coil springs 39 of this group 21 of test contacts are so strongly compressed that their total force similarly causes the release of this socket connection, if the piston-cylinder-unit 18 moves the supporting plate 19 again to the right.

This electrical connecting apparatus 10 as shown in FIGS. 1 to 9 is structurally most simple and allows rapid making of the electrical connection of the electrical or electronic device 25 to the tester 12 of the testing unit 13 for performing testing and also saves considerable time. Also it is economical. The groups of test contacts 21, 22 and 55 can be assembled at least in part from conventional plastic members, blades and sleeves and require only comparatively slight additional structural expense. The devices being tested 25 are protected, since no pulling forces are exerted on them in breaking the contact, but only pressing forces in plugging the device together with the device. The circuit board 27 of the device 25 is braced for receiving these pressing forces on a plurality of posts 20' of the stationary holder 26.

In case the circuit board 27 or the wire supporting device or the like of the device and the supporting plate 19 also experience horizontal pulling forces in a certain range, one can also provided that the restoring springs 39 of the electrical connecting apparatus 10 do not apply the entire forces for loosening of the socket connection, when one forms the restoring springs correspondingly weaker and/or provides fewer restoring springs.

While in the embodiments of FIGS. 2 to 7 the test contacts, namely the sleeves 33 and the blades 47, cannot change their spacing from the supporting plate 19, a group 55 of test contacts similarly forming a structural unit screwed releasably to the supporting plate 19 is provided in the embodiment of FIGS. 8 and 9 in which this change of spacing does occur. This group of test contacts 55, which act to contact a terminal strip 23 of the device, has an advantageously commercially marketed terminal strip 56 or a strip (pin strip) with straight metallic pins remaining parallel to each other, whose plastic plates 67 rest on the supporting plates 19 and are screwed to them by screws 30. Their blades mounted fixed on the plate 67 protrude on the rear side beyond this supporting plate 19 so that here a socket strip (such as the socket strip 36 in FIGS. 3 and 5) can be connected to it, which is connected by a cable or the like with the tester of the testing unit for its electrical connection. The test contacts of this group of test contacts 55 are here formed by the piston members 59 of equal spring contact pins 60 oriented parallel to each other.

The spring contact pin 60 is metallic and has a sleeve 61 which is plugged in with its rear end portion 62 on an associated terminal 57 or pin of the pin strip or the terminal strip 56 and thus is held on it frictionally in electrical connection with it. This sleeve 61 is held in the front in a passage of a plate 64 which is attached rigidly with the plate parallel to it.

The piston member 59 is slidably mounted in the straight sleeve 61 and protrudes beyond the sleeve in the direction of the device 25 and is spring-loaded by a restoring spring 39 formed by a precompressed coil spring located in the sleeve 61. The front head 63 of the piston member 59 is widened and provided on its front end with a conical recess 62. When one such group of test contacts 55 forming a structural unit is located on the supporting plate 19 of FIG. 1, then the front heads 63 of the spring contact pins 60 of all blades 29 of a terminal strip 23 must simultaneously contact on the device 25, when the blades are forced in the conical recess 62 of the free front end of the piston member 59 and these piston members are then retained on the device 25 by the blades 29 on further motion of the supporting plate 19 and are forced deeper into the sleeves 61.

The restoring springs 39 are strongly clamped and also exert simultaneously the forces on the piston members 59 which are required for a reliable electrical contact of the blades 29. In testing of the electrical or electronic device 25 the supporting plate 19 is pushed so far to the left by the piston-cylinder-unit 18 until also the test contacts 59 of this group of test contacts 55 are in a secure electrical contact with the blades of the terminal strip 23 to be contacted by it. They similarly exert pulling forces on the device and the supporting plate 19 in no stage of operation.

These spring contact pins 60 can be shaped on their front ends so that they act to contact the sleeves of a socket sleeve on the device. For example for this purpose the front end region of the piston member of the spring contact pins can be formed by the blades of a terminal strip.

In many cases it is especially advantageous when a plurality of groups of test contacts, such as 21, 22, 55 or also other groups of test contacts, are releasably connectable to connecting members, advantageously sleeve-terminal strips, providing electrical connection located in and/or on the supporting plate 19 or at least one other support, supporting device or other supporting means, as in the example according to FIGS. 5 to 7 for the groups of test contacts 22 where they are insertable in the sleeve-terminal strips 41 attached releasably to the supporting plate 19. This feature is suitable also in many cases for other groups of test contacts, advantageously for all groups or test contacts of the electrical connecting apparatus and/or of the test adapter. Also for the group of test contacts 21, as is shown in FIG. 10, a connecting member for electrical contact and mechanical mounting is mounted on the supporting plate 19 on the side or end facing the plate 35 of the group of test contact 21.

Advantageously the connecting member may be a socket strip 41 (or a terminal strip) equal or similar to the socket strip 41 of the embodiment according to FIGS. 5 to 7, in which the correspondingly shortened pins 32 of the group of test contacts 21 are insertable for electrical and frictional mechanical connection and holding of this group of test contacts 21. This socket strip 41 is here held exactly like the socket strip 41 in FIG. 3 alone by a socket strip 36 releasably attachable to its connecting pins 42 in a press fit on the rear side of the supporting plate 19. The socket strip 36 is connected to the testing unit by a cable 11.

Advantageously it can be provided that connecting members, formed the same, advantageously sleeve-terminal strips 41, are mounted on the supporting devices, advantageously a supporting plate 19 or some other support or a plurality of plates or other supporting devices for all groups of test contacts such as 21, 22, 55 and if necessary also other groups of test contacts. The connecting members then receive the rigid pins of the groups of test contacts, when these connecting members are sleeve-terminal strips, or, when these connecting members are blade-terminal strips, then the groups of test contacts corresponding with the sleeve-terminal strips or the sleeves mounted on them are inserted on this terminal strip.

Advantageously each connecting member such as 41 for each group of test contacts can be mounted on the related support, supporting plate 19 or the like. This has the advantage that in equipping of these supporting devices, supporting plates 19 or the like with these connecting members mounted directly on them, such as the sleeve-terminal strips 41 or the connecting, one need not consider or know which way the group of test contacts must be later connected to the connecting members, since for example one need not known whether it is a matter of a group 21 or 22 of test contacts or other group of test contacts, when, as is advantageously provided, the connecting members are equal for all test groups of contacts This connecting member can have pins such as 42 for its electrical connection which penetrate a wall of the like, here the supporting plate 19, and is insertable on the socket strip such as 36 to which cable 11 is connected which serves for electrical connection to the tester of the testing unit. These connecting members 36 can thus hold mechanically the associated other connecting members such as 41 simultaneously on the related supporting device or the like, here the supporting plate 19. In FIG. 11 in this way each group 21, 22 of test contacts is held on the supporting plate 19 by the assembled or plugged together sleeve-terminal strips 36, 41 contacting on the supporting plate 19.

The embodiment in FIG. 11 provides some variation from the embodiment shown in FIG. 1. The supporting plate 19 in FIG. 1 is supported on the rear side of the plate 17 of the supporting device 66 by a plurality of posts 20. It is however more advantageous to engage the plate 19 by all or a few of the connecting members, here the sleeve-terminal strips 36, located on the rear side of the plate 19, when the cable 11 acting for connection with the tester 12 is not located on the rear side but instead is laterally connected and one comes into contact with these connecting members, such as 36, with their rear side on the base or supporting plate 17 or other support. Also here the plates are arranged so that the sleeve-terminal strips 36 support themselves on the plate 17 against the pressing force exerted by the device on the groups of test contacts 21, 22. The connecting posts 20 shown in FIG. 1 can then be omitted as shown in FIG. 11.

It is understood that this supporting plate 19 is fixed in position in a suitable way, e.g. by screws 69 screwed in the plate 17 and located in it and a spacer piece put on these screws. One can then remove these plates 19 and they can be replaced or interchanged with other plates 19. These plates 19 with the groups of test contacts such as 21, 22 mounted on it and the connecting members such as 41 and 36 can also be called a test adapter which is mounted releasably on or applied to the supporting means, here the base plate 17.

The number of test contacts 33, 47 and 56 corresponds to that of the sleeves or blades of a sleeve-terminal strips 24 or terminal strip 23 of a device being tested 25 in each individually illustrated group of test contacts 21, 22 and 55.

One can also designate or call the supporting plate 19 together with the parts supported on it a test adapter for testing of the devices being tested. This test adapter can if necessary also form the electrical connecting apparatus or its supporting device alone.

By definition "stop means" referred to in the following for the pressing member comprise a shoulder, projection or the like of the device being tested.

We claim:

1. In an electrical connecting apparatus for a testing unit for testing an electrical or electronic device for electrical faults, said device having a circuit board, a wiring support or mounting member with a plurality of blade-terminal and/or sleeve-terminal strips, the improvement wherein said electrical connecting apparatus has at least one supporting device which has a plurality of test contacts for contacting blades and/or sleeves of said blade-terminal and/or sleeve-terminal strips on said electrical or electronic device and said electrical connecting apparatus has restoring spring means, the connection between said blades and/or sleeves of said blade-terminal and/or sleeve-terminal strips of said device and said test contacts being made only upon overcoming the spring forces of said restoring spring means.

2. The improvement defined in claim 1 in which said supporting device and/or a stationary holder of said electrical or electronic device being tested is drivable slidably to make electrical contact.

3. The electrical connecting apparatus defined in claim 1 in which said spring forces exerted by said restoring spring means are sufficient to break said contact between said blades and/or said sleeves of said blade-terminal strips and/or said sleeve-terminal strips of said device being tested and said test contacts, especially in case of connection between the aforesaid which can be made and again broken only exceeding friction forces so that said spring forces at least correspond in size to said friction forces.

4. The electrical connecting apparatus defined in claim 3 in which said spring restoring means comprises a plurality of restoring springs located in the vicinity of said test contacts.

5. The electrical connecting apparatus defined in claim 4 in which said restoring springs of said restoring spring means load at least one movable pressing member, which is pressable by said springs into contact with said device being tested.

6. The electrical connecting apparatus defined in claim 5 in which at least one of said restoring springs is a coil spring.

7. The electrical connecting apparatus defined in claim 5 in which said pressing member is guided linearly and is designed to fit said blade-terminal and/or said sleeve-terminal strips.

8. The electrical connecting apparatus defined in claim 7 in which said pressing member is formed so as to come into contact with at least one projection, shoulder or a facing surface of an associated blade-terminal strip and/or said sleeve-terminal strip of said device over the length of said associated terminal strip and/or said socket strip.

9. The electrical connecting apparatus defined in claim 3 in which at least one of said test contacts for said sleeves of said sleeve-terminal strips of said device being tested comprises an axial rigid pin.

10. The electrical connecting apparatus defined in claim 3 in which at least one of said test contacts for one of said blades and/or said sleeves of said blade-terminal and/or said sleeve-terminal strips comprises a spring contact pin, in which the opposing surface of a piston member of said spring contact pin acting to contact said terminal of said device being tested has a recess in which said terminal can be inserted.

11. The electrical connecting apparatus defined in claim 10 in which said recess of said spring contact pin is conical.

12. The electrical connecting apparatus defined in claim 11 in which said test contacts comprise said sleeves of at least one of said sleeve-terminal strips.

13. The electrical connecting apparatus defined in claim 12 in which said sleeve-terminal strip of said electrical connecting apparatus is mounted on said supporting device and has a plurality of pins on which a pressing member is mounted slidably, which is spring-loaded in the direction of said sleeve-terminal strip by a plurality of restoring springs one of which is mounted on at least one of said pins.

14. The electrical connecting apparatus defined in claim 3 in which said test contacts acting to contact one of said sleeve-terminal strips of said device being tested comprise said blades of one of said blade-terminal strips attached rigidly with said supporting device of said electrical connecting apparatus, a pressing member being slidably mounted on said blades of said terminal strip and said pressing member has a plurality of passages which are penetrated by said blades, each of said passages being associated with each of said blades and said pressing member is spring-loaded by a plurality of restoring springs, said restoring springs being coil springs which are mounted on a plurality of said blades, said coil springs spring-loading said pressing member in the direction said supporting device is moved away and stop means are provided so that motion of said pressing member from said supporting device is limited so that, when said blades of said blade-terminal strips are plugged in said sleeve-terminal strip of said device being tested, said pressing member is pushed in the direction of said supporting device by said device being tested against the action of said restoring springs on said blades of said terminal strip.

15. The electrical connecting apparatus defined in claim 3 in which groups of said test contacts in said electrical connecting apparatus each form a structural unit, which is formed to contact said terminal and/or said sleeves of said sleeve-terminal strip.

16. The electrical connecting apparatus defined in claim 3 in which said test contacts are mounted on a supporting plate which is mountable detachably on said supporting device or which forms said supporting device.

17. The electrical connecting apparatus defined in claim 16 in which said supporting plate together with the parts of said electrical connecting apparatus mounted thereon forms a test adapter.

18. The electrical connecting apparatus defined in claim 3 in which said supporting device has on a front side facing said device being tested a plurality of connecting members acting to make electrical contact with said test contacts.

19. The contact defined in claim 18 in which said connecting member comprises at least one sleeve-terminal strip and/or said terminal strip for connection of said test contacts or at least one group of said test contacts which are detachably insertable in said connecting member, said connecting member having a plurality of pins on a rear side which are useful for said electrical connection.

20. The electrical connecting apparatus defined in claim 18 in which each of said connecting members for each group of said test contacts is mounted on at least one of said supporting plates and said connecting members are the same.

21. The electrical connecting apparatus defined in claim 18 in which a first of said connecting members is mounted on one of said supporting plates, since said supporting plate has a plurality of connecting pins penetrating a wall, plate or plate region of said supporting plate in a predetermined location for support, on a rear side of said wall, plate or plate region a second connecting member for electrical connection being attached, said second connecting member comprising one of said sleeve-terminal strips which also acts to hold releasably the first connecting member on said wall, plate or plate region.

22. The electrical connecting apparatus defined in claim 21 in which said connecting member on said rear side of said walls, plate or plate region of said supporting device or said supporting plate is connected to a cable of a tester of said testing unit.

23. The electrical connecting apparatus defined in claim 22 wherein such supporting device comprises a plate portion bracing said connecting members against pressing forces exerted by said device being tested.

24. A testing unit for contact strips having a multiplicity of terminal ends anchored in a strip body, said testing unit comprising:
   an electrically insulating support plate displaceable toward and away from said strip body;
   an electrically insulating further plate extending along and displaceable by said support plate;
   a multiplicity of electrically conductive mutually parallel contact pins positioned to register with said terminal ends anchored in said further plate and having contact ends engageable with said terminal ends, shanks extending to said contact ends from said further plate, and connecting end portions extending through said further plate and said support plate while projecting from said support plate away from said body;
   an electrically insulating pressing member shaped to interfit with said strip body and spaced from said further plate;
   a multiplicity of precompressed springs braced between said further plate and said pressing member for resisting displacement of said pressing member toward said further plate upon displacement of said support plate toward said body, at least some of said spring surrounding respective ones of said shanks; and
   means limiting the displacement of said pressing member away from said further plate for disposing said contact ends of said pins substantially at a surface of said pressing member turned toward said body, whereby said contact ends remain retracted until said supporting plate is displaced toward said body and then grippingly engage said terminal ends, but said springs automatically draw said pins back into retracted positions upon displacement of said support plate away from said body and release said pressing member from said body.

* * * * *